United States Patent
Liaw

(10) Patent No.: US 8,472,227 B2
(45) Date of Patent: Jun. 25, 2013

(54) INTEGRATED CIRCUITS AND METHODS FOR FORMING THE SAME

(75) Inventor: Jhon Jhy Liaw, Zhudong Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 469 days.

(21) Appl. No.: 12/694,846

(22) Filed: Jan. 27, 2010

(65) Prior Publication Data
US 2011/0182098 A1 Jul. 28, 2011

(51) Int. Cl.
*G11C 5/02* (2006.01)

(52) U.S. Cl.
USPC .................. 365/51; 365/63; 365/72

(58) Field of Classification Search
USPC .................. 365/51, 63, 72, 189.08
See application file for complete search history.

(56) References Cited

U.S. PATENT DOCUMENTS

| | | | |
|---|---|---|---|
| 5,581,202 A * | 12/1996 | Yano et al. ................... | 326/101 |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 * | 1/2003 | Watanabe et al. ............. | 438/253 |
| 6,613,634 B2 * | 9/2003 | Ootsuka et al. ............... | 438/275 |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 * | 4/2004 | Takao ........................... | 257/371 |
| 6,740,247 B1 | 5/2004 | Han et al. | |
| 6,743,673 B2 * | 6/2004 | Watanabe et al. ............. | 438/253 |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 * | 9/2005 | Sharma et al. ................ | 365/158 |
| 6,949,768 B1 * | 9/2005 | Anderson et al. ............. | 257/74 |

(Continued)

FOREIGN PATENT DOCUMENTS

| CN | 1945829 | 4/2004 |
|---|---|---|
| CN | 101179046 | 5/2005 |

(Continued)

OTHER PUBLICATIONS

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

(Continued)

*Primary Examiner* — Viet Q Nguyen
(74) *Attorney, Agent, or Firm* — Lowe Hauptman Ham & Berner, LLP

(57) ABSTRACT

An integrated circuit including a first memory array and a logic circuit coupled with the first memory array. All active transistors of all memory cells of the first memory array and all active transistors of the logic circuit are Fin field effect transistors (FinFETs) and have gate electrodes arranged along a direction a first longitudinal direction.

16 Claims, 7 Drawing Sheets

U.S. PATENT DOCUMENTS

| | | | |
|---|---|---|---|
| 6,964,832 B2 * | 11/2005 | Moniwa et al. | 430/30 |
| 7,009,273 B2 * | 3/2006 | Inoh et al. | 257/522 |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 * | 8/2006 | Takao | 257/758 |
| 7,112,495 B2 | 9/2006 | Ko et al. | |
| 7,153,744 B2 * | 12/2006 | Chen et al. | 438/267 |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,298,600 B2 | 11/2007 | Takikawa et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,662 B2 | 4/2008 | Siddiqui et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 * | 7/2008 | Kim et al. | 257/213 |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 * | 9/2008 | Liu et al. | 257/306 |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,671,417 B2 * | 3/2010 | Yoshida et al. | 257/365 |
| 7,682,911 B2 | 3/2010 | Jang et al. | |
| 7,692,254 B2 * | 4/2010 | Anderson et al. | 257/401 |
| 7,723,786 B2 * | 5/2010 | Kakoschke et al. | 257/347 |
| 7,754,560 B2 * | 7/2010 | Burnett et al. | 438/212 |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,337 B2 * | 4/2011 | Chang et al. | 438/303 |
| 7,923,339 B2 | 4/2011 | Meunier-Beillard et al. | |
| 7,939,412 B2 * | 5/2011 | Orlowski et al. | 438/284 |
| 7,960,791 B2 | 6/2011 | Anderson et al. | |
| 7,985,633 B2 * | 7/2011 | Cai et al. | 438/155 |
| 7,989,846 B2 * | 8/2011 | Furuta | 257/206 |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 8,189,376 B2 * | 5/2012 | Koldiaev | 365/174 |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Mantl | |
| 2006/0214212 A1 | 9/2006 | Horita et al. | |
| 2006/0258156 A1 | 11/2006 | Kittl | |
| 2007/0001173 A1 | 1/2007 | Brask et al. | |
| 2007/0004218 A1 | 1/2007 | Lee et al. | |
| 2007/0015334 A1 | 1/2007 | Kittl et al. | |
| 2007/0020827 A1 | 1/2007 | Buh et al. | |
| 2007/0024349 A1 | 2/2007 | Tsukude | |
| 2007/0029576 A1 | 2/2007 | Nowak et al. | |
| 2007/0048907 A1 | 3/2007 | Lee et al. | |
| 2007/0076477 A1 | 4/2007 | Hwang et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0166929 A1 | 7/2007 | Matsumoto et al. | |
| 2007/0178637 A1 | 8/2007 | Jung et al. | |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 * | 10/2007 | Watanabe et al. | 365/185.14 |
| 2007/0254440 A1 | 11/2007 | Daval | |
| 2008/0001171 A1 | 1/2008 | Tezuka et al. | |
| 2008/0036001 A1 | 2/2008 | Yun et al. | |
| 2008/0042209 A1 | 2/2008 | Tan et al. | |
| 2008/0050882 A1 | 2/2008 | Bevan et al. | |
| 2008/0085580 A1 | 4/2008 | Doyle et al. | |
| 2008/0085590 A1 | 4/2008 | Yao et al. | |
| 2008/0095954 A1 | 4/2008 | Gabelnick et al. | |
| 2008/0102586 A1 | 5/2008 | Park | |
| 2008/0124878 A1 | 5/2008 | Cook et al. | |
| 2008/0227241 A1 | 9/2008 | Nakabayashi et al. | |
| 2008/0265344 A1 | 10/2008 | Mehrad et al. | |
| 2008/0290470 A1 | 11/2008 | King et al. | |
| 2008/0296632 A1 | 12/2008 | Moroz et al. | |
| 2008/0318392 A1 | 12/2008 | Hung et al. | |
| 2009/0026540 A1 | 1/2009 | Sasaki et al. | |
| 2009/0039388 A1 | 2/2009 | Teo et al. | |
| 2009/0066763 A1 | 3/2009 | Fujii et al. | |
| 2009/0155969 A1 | 6/2009 | Chakravarti et al. | |
| 2009/0166625 A1 | 7/2009 | Ting et al. | |
| 2009/0181477 A1 | 7/2009 | King et al. | |
| 2009/0200612 A1 * | 8/2009 | Koldiaev | 257/368 |
| 2009/0239347 A1 | 9/2009 | Ting et al. | |
| 2009/0321836 A1 | 12/2009 | Wei et al. | |
| 2010/0155790 A1 | 6/2010 | Lin et al. | |
| 2010/0163926 A1 | 7/2010 | Hudait et al. | |
| 2010/0187613 A1 | 7/2010 | Colombo et al. | |
| 2010/0207211 A1 | 8/2010 | Sasaki et al. | |
| 2010/0308379 A1 | 12/2010 | Kuan et al. | |
| 2011/0018065 A1 | 1/2011 | Curatola et al. | |
| 2011/0108920 A1 | 5/2011 | Basker et al. | |
| 2011/0129990 A1 | 6/2011 | Mandrekar et al. | |
| 2011/0195555 A1 | 8/2011 | Tsai et al. | |
| 2011/0195570 A1 | 8/2011 | Lin et al. | |
| 2011/0256682 A1 | 10/2011 | Yu et al. | |
| 2012/0086053 A1 | 4/2012 | Tseng et al. | |

FOREIGN PATENT DOCUMENTS

| | | |
|---|---|---|
| CN | 1011459116 | 6/2009 |
| JP | 2004-71118 | 3/2004 |
| JP | 2006-303451 | 11/2006 |
| JP | 2007-194336 | 8/2007 |
| JP | 2007-250567 | 9/2007 |
| JP | 2009-81452 | 4/2009 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 2, 2012 from corresponding application No. CN 201010196345.0.

Office Action dated May 4, 2012 from corresponding application No. CN 201010243667.6.

Lenoble, Damien, STMicroelectronics, Crolles Cedex, France, "Plasma Doping as an Alternative Route for Ultra-Shallow Junction Integration to Standard CMOS Technologies", Semiconductor Fabtec—16th Edition, pp. 1-5, 2002.

Shikida, Mitsuhiro, et al., "Comparison of Anisotropic Etching Properties Between KOH and TMAH Solutions", IEEE Xplore, Jun. 30, 2010, pp. 315-320, 1999.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the Internet <URL:http://tsmc.com/english/dedicatedFoundry/technology/90nm.htm, 2004.

Merriam Webster definition of substantially retrieved from the Internet <URL:http://www.merriam-webster.com/dictionary/substantial>, 2013.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon $Si_{1-Y}C_y$ Source Drain Stressors with High Carbon Content", IEEE Transactions on Electron Devices 55.9 (2008): 2475-483.

Office Action dated Mar. 28, 2012 from corresponding application No. CN 201010228334.6, 2012.

Notice of Decision on Patent dated Mar. 12, 2012 from corresponding application No. 10-2010-0072103, 2012.

OA dated Mar. 27, 2012 from corresponding application No. KR10-2010-0094454, 2012.

OA dated Mar. 29, 2012 from corresponding application No. KR10-2010-0090264, 2012.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d., 2007.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Office Action dated Jan. 9, 2013 from corresponding application No. TW099116782.

Office Action dated Jan. 29, 2013 from corresponding application No. JP 2011-014013.

\* cited by examiner

INTEGRATED CIRCUITS AND METHODS FOR FORMING THE SAME

CROSS-REFERENCE TO RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. Ser. No. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present application relates generally to the field of semiconductor devices, and more particularly, to integrated circuits and methods for forming the integrated circuits.

BACKGROUND

Memory circuits have been used in various applications. Conventionally, memory circuits can include DRAM, SRAM, and non-volatile memory circuits. An SRAM circuit includes a plurality of memory cells. For a conventional 6-T static memory in which arrays of memory cells are provided, each of the memory cells consists of six transistors. The 6-T SRAM memory cell is coupled with a bit line (BL), a bit line bar (BLB), and a word line (WL). Four of the six transistors form two cross-coupled inverters for storing a datum representing "0" or "1". The remaining two transistors serve as access transistors to control the access of the datum stored within the memory cell.

SUMMARY

In one embodiment, an integrated circuit including a first memory array and a logic circuit coupled with the first memory array. All active transistors of all memory cells of the first memory array and all active transistors of the logic circuit are Fin field effect transistors (FinFETs) and have gate electrodes arranged along a first longitudinal direction.

In another embodiment, a method for forming an integrated circuit includes forming a plurality of first active areas for all active transistors of a first memory array over a substrate and a plurality of second active areas for all active transistors of a logic circuit over the substrate. A plurality of first gate electrodes for the all active transistors of the first memory array and a plurality of second gate electrodes for the all active transistors of the logic circuit are formed. The first gate electrodes are arranged along a direction perpendicular to the first active area and the second gate electrodes are arranged along a direction perpendicular to the second active areas and parallel with the first gate electrodes.

These and other embodiments, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
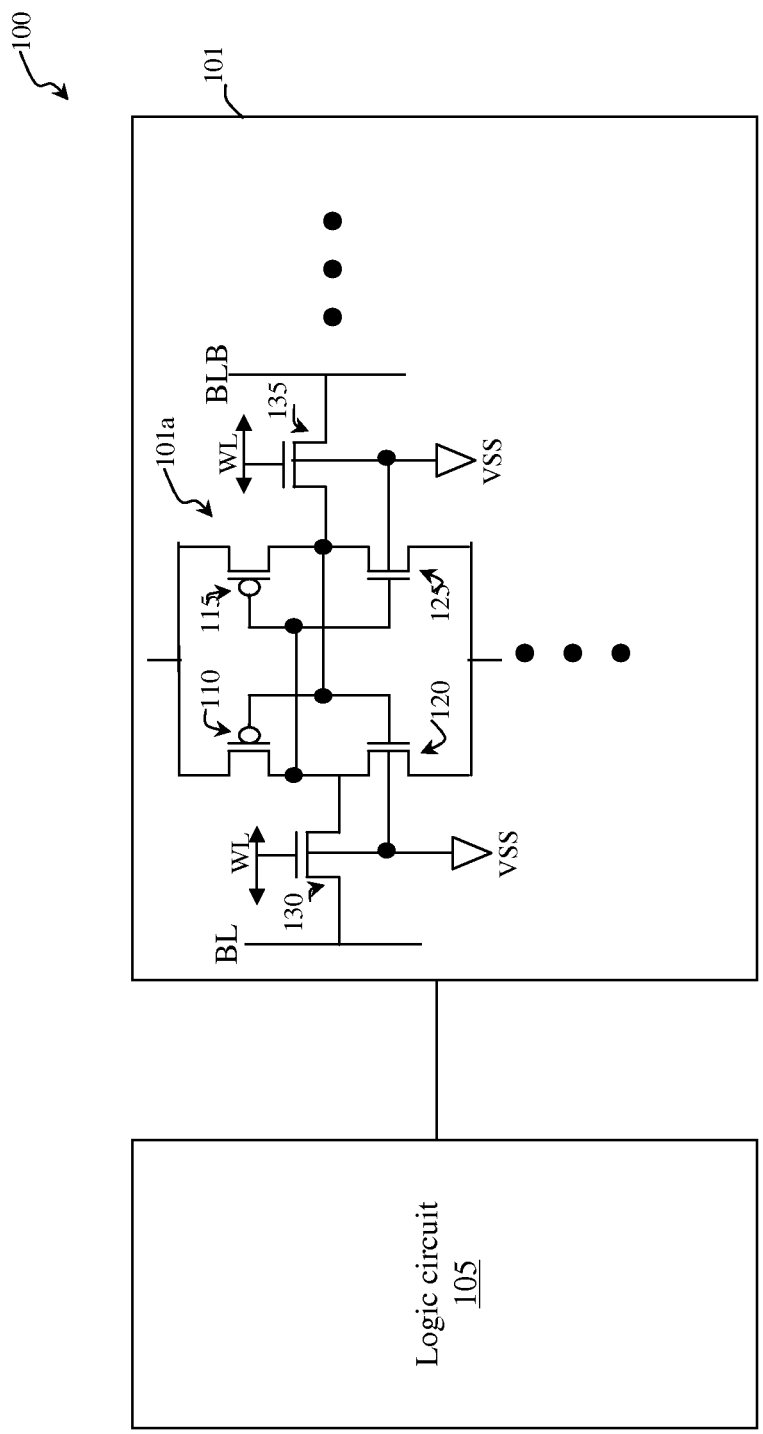
FIG. 1 is a schematic drawing illustrating an exemplary integrated circuit including at least one memory array.

A conventional SRAM circuit has a memory array and at least one control logic circuit. Each of the memory array and the control logic circuit has a plurality of transistors. The transistors have active areas and gate electrodes. The active areas are formed within a substrate and generally referred to as planar active areas. Conventionally, routing directions of the gate electrodes and the active areas of the transistors of the control logic circuit are usually along two directions perpendicular to each other. To form source/drain (S/D) regions of the transistors in the active areas of the control logic circuit, four ion implantation processes are used. Each of the ion implantation processes is performed while the substrate carrying the conventional SRAM circuit is processed at 0°, 90°, 180°, and 270° positions. The four ion implantation processes increase the manufacturing cost of the integrated circuit.

From the foregoing, memory circuits and methods for forming the memory circuits are desired.

It is understood that the following disclosure provides many different embodiments, or examples, for implementing different features of the application. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing illustrating an exemplary integrated circuit including at least one memory array. In FIG. 1, an integrated circuit 100 can include at least one memory array, e.g., a memory array 101 and a logic circuit 105. The logic circuit 105 can be coupled with the memory array 101. All active transistors of all memory cells of the memory array 101 and all active transistors of the logic circuit 105 can have gate electrodes arranged along the same longitudinal direction. In embodiments, word lines of all active transistors of the memory array 101 and word lines of all active transistors of the logic circuit 105 are arranged along the same longitudinal direction.

The memory array 101 can include a plurality of word lines WLs and a plurality of bit lines BLs and BLBs. In some embodiments, the memory array 101 can be a static random access memory (SRAM) array, an embedded SRAM array, dynamic random access memory (DRAM) array, an embedded DRAM array, a non-volatile memory array, e.g., FLASH, EPROM, E²PROME, a field-programmable gate array, a logic circuit array, and/or other memory array.

For embodiments using a 6-T SRAM memory cell, the memory array 101 can include a plurality of memory cells, e.g., a memory cell 101a, repetitively disposed in the memory array 101. The memory cell 101a can be coupled with a bit line BL, a bit line bar BLB, and a word line WL. It is noted that though only one memory cell 101a is depicted, other memory cells (not shown) can be coupled with their corresponding word lines WLs and bit lines BLs of the memory array. A portion of the memory array 101 may have 8, 16, 32, 64, 128, or more columns that can be arranged in word widths. In embodiments, the word lines can be laid out substantially orthogonally to the bit lines. In other embodiments, other arrangements of the word lines and bit lines can be provided. It is noted that the description of the memory cell 101a is merely exemplary. In other embodiments, the memory cell 101a can be an 8-T SRAM memory cell, 1-T SRAM memory cell, or any type memory cell.

Referring again to FIG. 1, the memory cell 101a can include active transistors 110, 115, 120, 125, 130, and 135. The active transistors 110, 115, 120, 125, 130, and 135 can be operable for a memory cell operation, e.g., read or write. In one embodiment, the active transistors 110, 120 and 115, 125 can be operable as two cross-latch inverters forming a flip-flop for storing the datum in the memory cell 101a. The active transistors 130 and 135 can be operable as two pass transistors, access transistors, or pass gates. In some embodiments, the active transistors 110 and 115 can be referred to as pull-up transistors and the active transistors 120 and 125 can be referred to as pull-down transistors. The pull-up transistors can be configured to pull a voltage level towards a power source voltage level, e.g., VDD. The pull-down transistors can be configured to pull a voltage level towards another power source voltage level, e.g., VSS.

In embodiments, a drain of the active transistor 110 can be electrically coupled with a source of the active transistor 130, a drain of the active transistor 120, and a gate of the active transistor 115. A drain of the active transistor 115 can be electrically coupled with a source of the active transistor 135, a drain of the active transistor 125, and a gate of the active transistor 110. The gate of the active transistor 110 can be coupled with the gate of the active transistor 120. The gate of the active transistor 115 can be coupled with the gate of the active transistor 125.

Drains of the active transistors 130 and 135 can be electrically coupled with the bit line BL and bit line bar BLB, respectively. The gates of the active transistors 130 and 135 can be electrically coupled with the word line WL. The bit lines BL, BLB and the word line WL may extend to other memory cells of the memory array. It is noted that the number, type, and disposition of the active transistors 110, 115, 120, 125, 130, and 135 are merely exemplary. One of skill in the art is able to modify the number, type, and disposition of the active transistors to achieve a desired memory array.

Figure 2A:
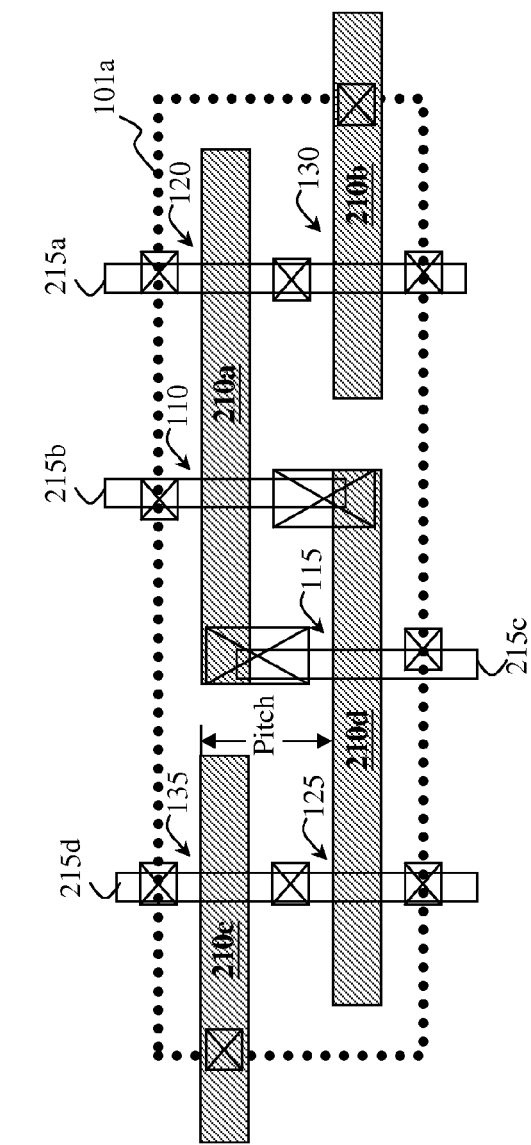
FIG. 2A is a schematic drawing illustrating a top view including active areas, gate electrodes, and contacts of an exemplary memory cell.

FIG. 2A is a schematic drawing illustrating a top view including active areas, gate electrodes, and contacts of an exemplary memory cell. In FIG. 2A, the memory cell 101a can have gate electrodes 210a-210d arranged along a first longitudinal direction. The memory cell 101a can have active regions 215a-215d arranged along a second longitudinal direction. The second longitudinal direction is substantially perpendicular to the first longitudinal direction. As noted, the memory array 101 can include a plurality of memory cells. Each of the memory cells can have a structure similar to that of the memory cell 101a disposed in the memory array 101. From the foregoing, the gate electrodes of all active transistors of all memory cells of the memory array 101 can be aligned in the same longitudinal direction.

Figure 2B:
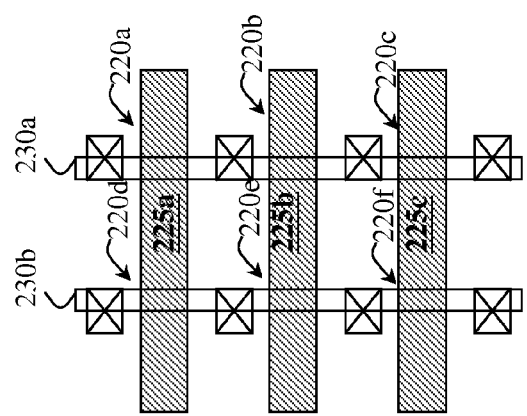
FIG. 2B is a schematic drawing illustrating a top view including active areas, gate electrodes, and contacts of a portion of an exemplary control logic.

FIG. 2B is a schematic drawing lustrating a top view including active areas, gate electrodes, and contacts of a portion of an exemplary logic circuit. A portion of the logic circuit 105 can include a plurality of active transistors, e.g., active transistors 220a-220f. The active transistors 220a-220f are operable for a memory cell operation, e.g., read or write. The active transistors 220a-220f can have a plurality of gate electrodes, e.g., gate electrodes 225a-225c, and active areas, e.g., active areas 230a-230b. The longitudinal direction of the gate electrodes 225a-225c can be the same as that of the gate electrodes 210a-210d of the memory cell 101a. The longitudinal direction of the gate electrodes 225a-225c can be substantially perpendicular to that of the active areas 230a-230b. In embodiments, the logic circuit 105 can include a control logic, an input/output (IO) interface, an address register, an input buffer, a sense amplifier, an output buffer, or any combinations thereof.

As noted, all gate electrodes of all active transistors of all memory cells of the memory array 101 and the gate electrodes of all active transistors of the logic circuit 105 can be disposed along the same longitudinal direction, e.g., horizontal direction. All active areas for all active transistors of the memory array 101 and all active areas for all active transistors of the logic circuit 105 can be disposed along the same longitudinal direction, e.g., vertical direction. As such, all source/drain (S/D) regions (not labeled) for the active transistors of the memory array 101 and the logic circuit 105 can be merely subjected to two ion implantation processes along the direction substantially parallel with the longitudinal direction of the gate electrodes.

In embodiment, the gate electrodes of all active transistors of all memory cells of the memory array 101 can have the same pitch. For example, the pitch defined between the edges of the gate electrodes 210c and 210d can be the same as that between the edge of the gate electrode 210d and the edge of another gate electrode (not shown) neighboring and below the gate electrode 210d.

Figure 3:
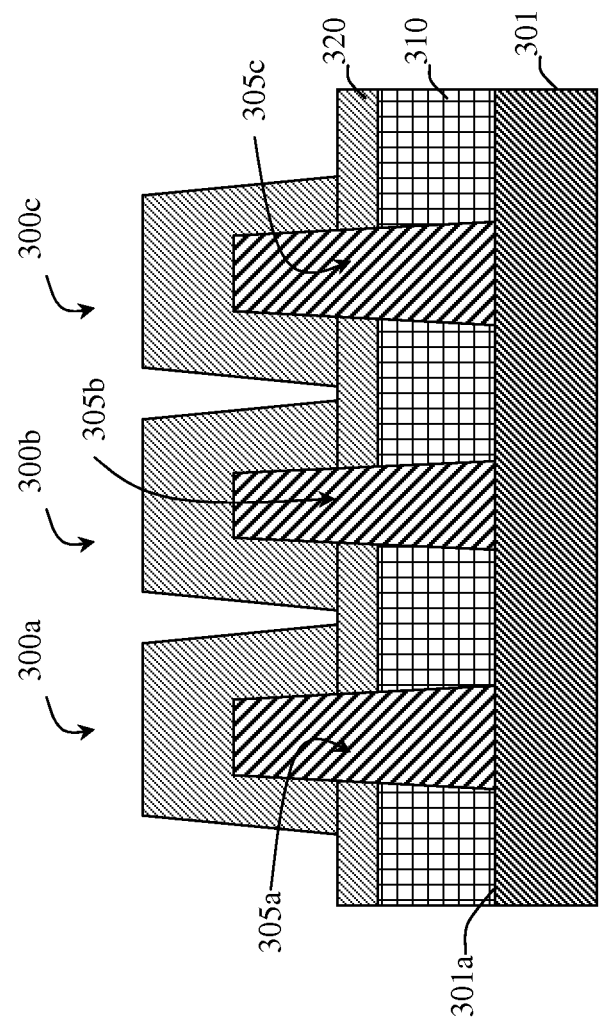
FIG. 3 is a cross-sectional view of exemplary FinFETs.

In embodiment, each of the active transistors 110, 115, 120, 125, 130, 135, and 220a-220f can be a Fin field effect transistor (FinFET). FIG. 3 is a cross-sectional view of exemplary FinFETs. In FIG. 3, FinFETs 300a-300c can be disposed over a substrate 301. The substrate 301 can include a plurality of active areas 305a-305c. In embodiments, the active areas 305a-305c can be referred to as non-planar active areas over a surface 301a of the substrate 301.

In embodiments, the substrate 301 may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and indium antimonide. The alloy semiconductor material can include SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

Referring again to FIG. 3, an isolation material 310 can be disposed over the surface 301a of the substrate 301. The isolation material 310 can be disposed around the active areas 305a-305c of the FinFETs 300a-300c. The isolation material 310 can electrically isolate two neighboring active areas 305a, 305b or 305b, 305c. The isolation material 310 can include a shallow trench isolation (STI) structure, a local oxidation of silicon (LOCOS) structure, other isolation structure, or any combination thereof.

In embodiments, a gate dielectric (not shown) can be formed over the active areas 305a-305c. The gate dielectric can include a single layer or a multi-layer structure. In embodiments having a multi-layer structure, the gate dielectric can include an interfacial dielectric layer and a high-k dielectric layer. The interfacial dielectric layer may be formed by any suitable process and any suitable thickness. For example, the interfacial dielectric layer may include a material such as oxide, nitride, oxynitride, other gate dielectric materials, and/or combinations thereof. The interfacial dielectric layer can b formed by thermal processes, CVD processes, ALD processes, epitaxial processes, and/or combinations thereof.

The high-k dielectric layer can be formed over the interfacial layer. The high-k dielectric layer can include high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer may be formed by any suitable process, such as ALD, CVD, PVD, RPCVD, PECVD, MOCVD, sputtering, plating, other suitable processes, and/or combinations thereof.

Referring again to FIG. 3, a gate electrode 320 can be disposed over the active areas 305a-305c. In embodiments, the gate electrode 320 can include one or more materials including polysilicon, Ti, TiN, TaN, Ta, TaC, TaSiN, W, WN, MoN, MoON, $RuO_2$, and/or other suitable materials. The gate electrode 320 may include one or more layers formed by physical vapor deposition (PVD), CVD, ALD, plating, and/or other suitable processes. In embodiments, the gate electrode 320 can include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In embodiments, the memory array 101 (shown in FIG. 1) can include at least one dummy memory cell (not shown). The dummy memory cell can be disposed adjacent at least one of the all active transistors of the memory array 101. In embodiments, the dummy memory cell can be disposed at the peripheral areas and/or edges of the memory array 101. The dummy memory cell can be configured for desirably reducing the process loading difference at the center and edges of the memory array 101. The dummy memory cell is free from providing any operation, e.g., read or write, of the memory cell 101a. In embodiments, the routing direction of the gate electrode of the dummy memory cell can be parallel with the longitudinal direction of the gate electrodes 210a-210d or the active areas 215a-215d.

Figure 4:
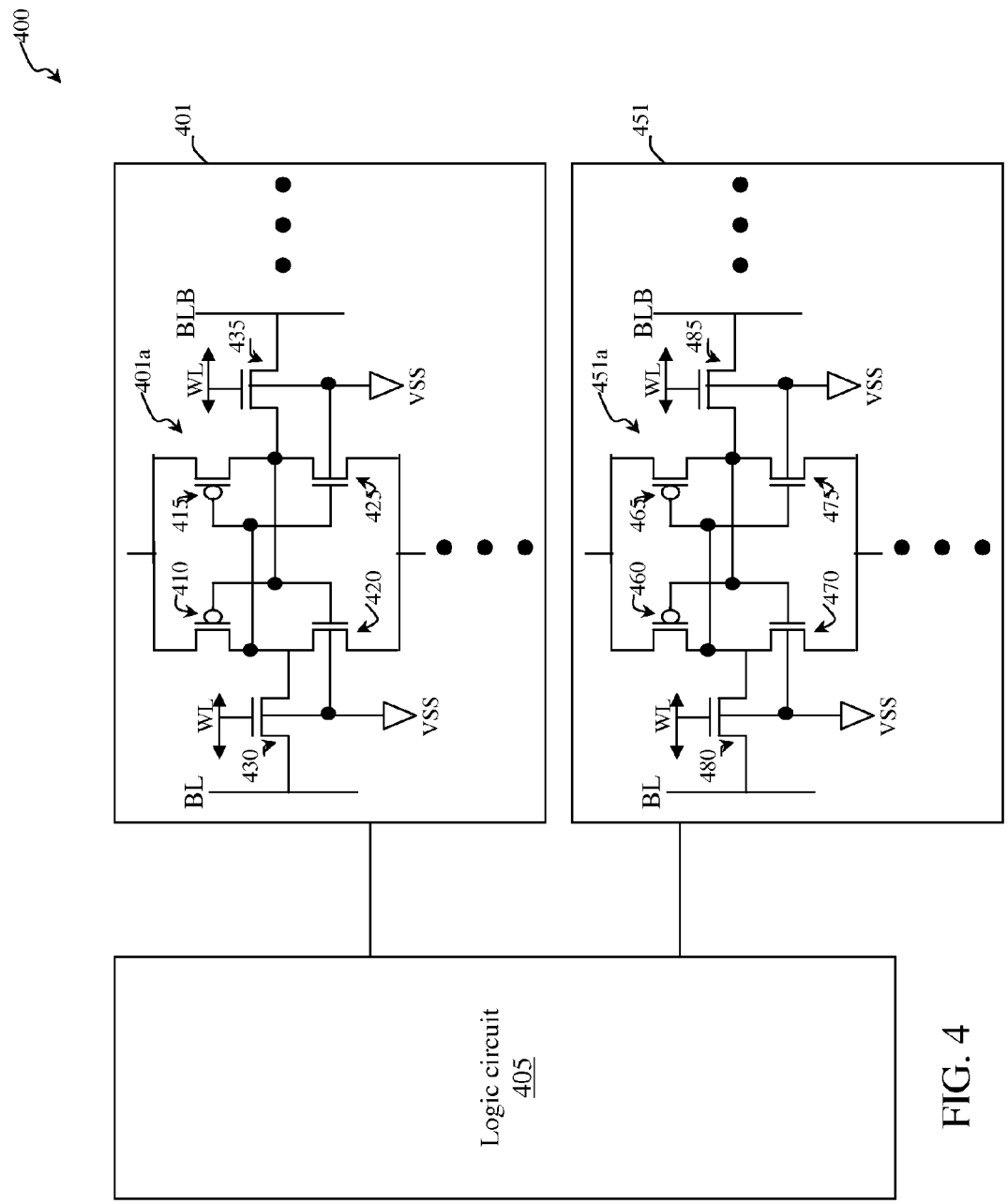
FIG. 4 is a schematic drawing illustrating another exemplary integrated circuit.

FIG. 4 is a schematic drawing illustrating another exemplary integrated circuit. In FIG. 4, an integrated circuit 400 can include multiple memory arrays, e.g., memory arrays 401 and 451, electrically coupled with a control logic 405. Items of FIG. 4 that are the same items in FIG. 1 are indicated by the same reference numerals, increased by 300. In embodiments, the memory array 451 can have the same or different memory capacity of the memory array 401. The memory cell 451a can have the same or different structure of the memory cell 401a. The memory cell 451a can include active transistors 460, 465, 470, 475, 480, and 485. The active transistors 460, 465, 470, 475, 480, and 485 can be similar to the active transistors 110, 115, 120, 125, 130, and 135, respectively.

For embodiments using a 6-T SRAM memory cell, the memory array 451 can include a plurality of word lines WLs and a plurality of bit lines BLs and BLBs. The memory array 451 can include at least one memory cell 451a. The memory cell 451a can be coupled with a bit line BL, a bit line bar BLB, and a word line WL. It is noted that though only one memory cell 451a is depicted, other memory cells (not shown) can be coupled with the plurality of word lines WLs and bit lines BLs of the memory array. A portion of the memory array 451 may have 8, 16, 32, 64, 128 or more columns that can be arranged in word widths. In embodiments, the word lines can be laid out substantially orthogonally to the bit lines. In other embodiments, other arrangements of the word lines and bit lines can be provided.

Figure 5:
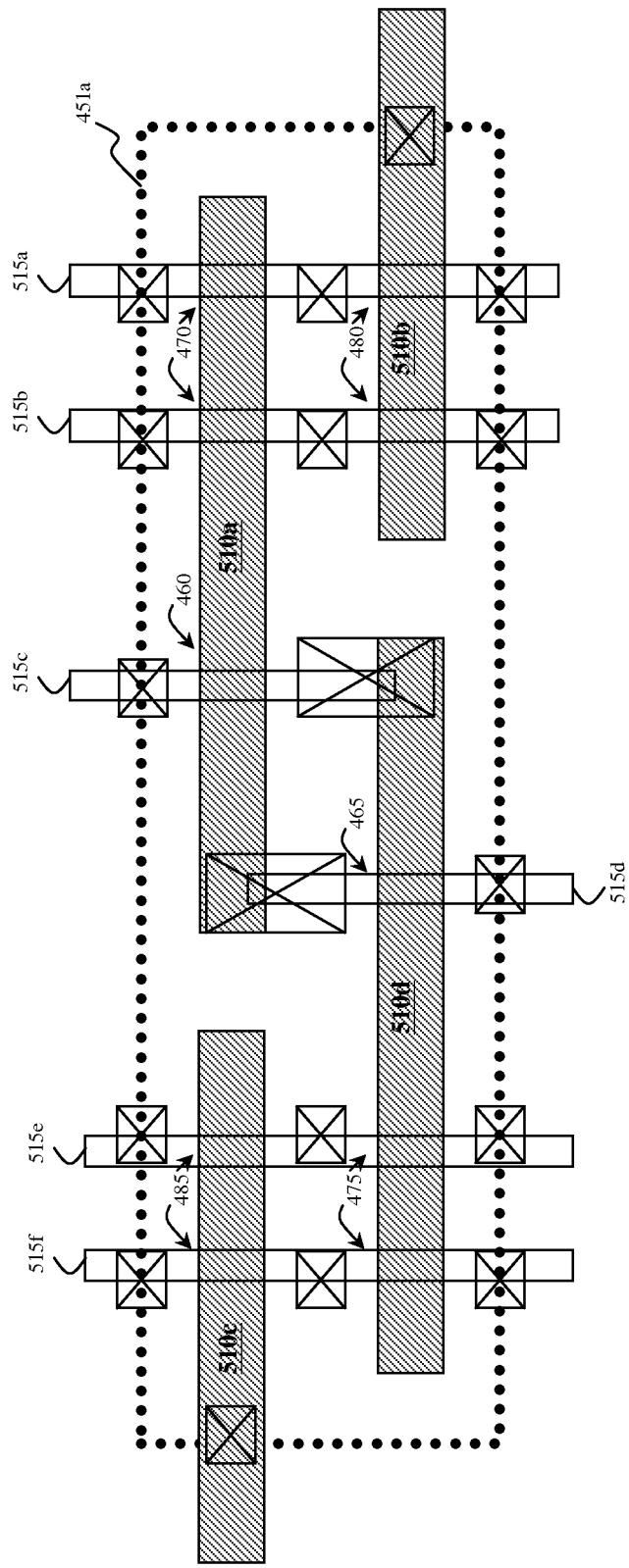
FIG. 5 is a schematic drawing illustrating a top view including active areas, gate electrodes, and contacts of another exemplary memory cell.

FIG. 5 is a schematic drawing illustrating a top view including active areas, gate electrodes, and contacts of another exemplary memory cell. In FIG. 5, the memory cell 451a can have gate electrodes 510a-510d arranged along a first longitudinal direction. The memory cell 451a can have active regions 515a-515f arranged along a second longitudinal direction. The second longitudinal direction is substantially perpendicular to the first longitudinal direction. As noted, the memory array 451 can include a plurality of memory cells. Each of the memory cells can have a structure similar to that of the memory cell 451a and be disposed in the memory array 451. From the foregoing, the gate electrodes of all active transistors of all memory cells of the memory array 451 can be arranged along the same longitudinal direction. In embodiments, the gate electrodes of all active transistors of the memory array 401, the logic circuit 405, and the memory array 451 can arranged along the same longitudinal direction, e.g., a horizontal direction. The active areas for all active transistors of the memory array 401, the logic circuit 405, and the memory array 451 can be arranged along the same longitudinal direction, e.g., vertical direction.

Figure 6:
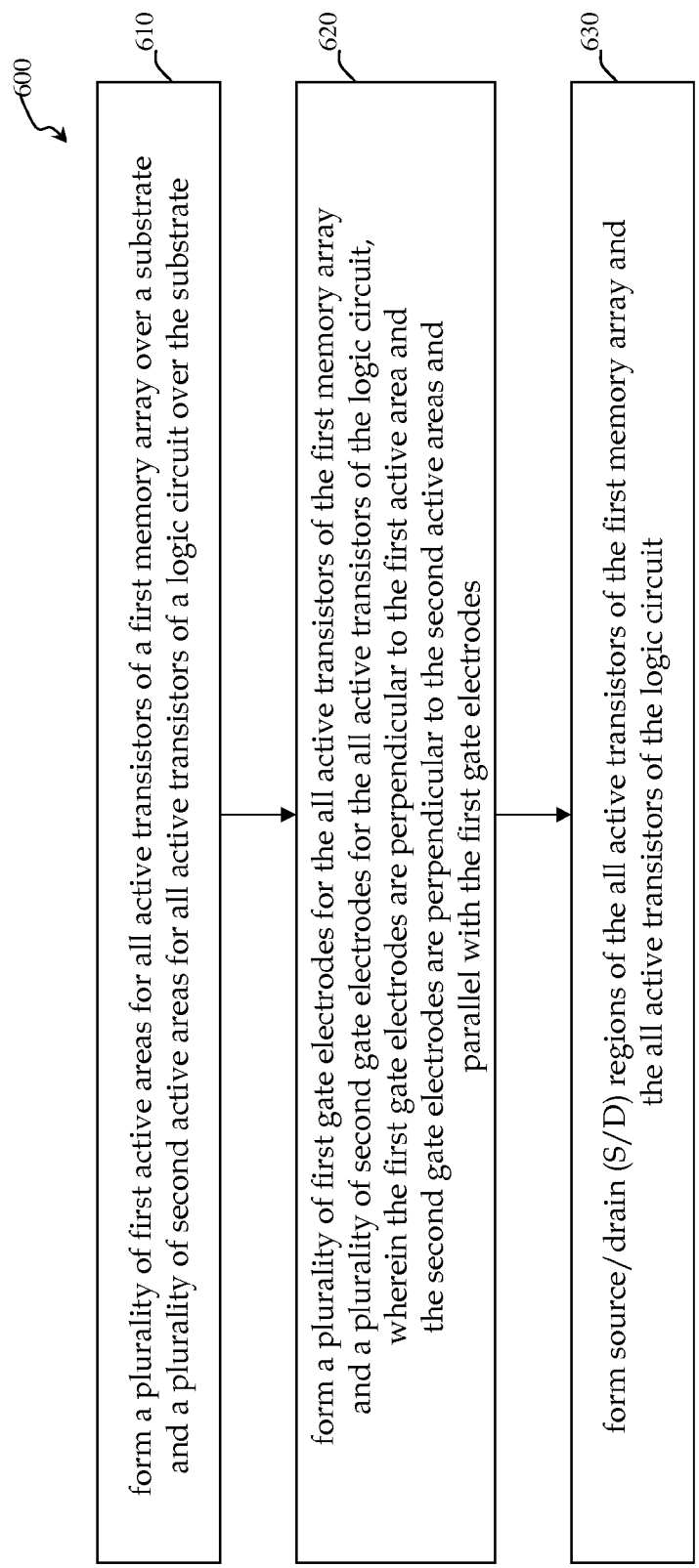
FIG. 6 is a flowchart illustrating an exemplary method for forming an integrated circuit.

FIG. 6 is a flowchart illustrating an exemplary method for forming an integrated circuit. In FIG. 6, a method 600 of forming an integrated circuit can include Step 610 for forming a plurality of first active areas for all active transistors of a first memory array over a substrate and a plurality of second active areas for all active transistors of a logic circuit over the substrate. For example, Step 610 can form the active areas 215a-215d and 230a-230b (shown in FIGS. 2A-2B) over a substrate. In embodiments, the active areas 215a-215d and 230a-230b can be defined by recessing portions of the substrate. In other embodiments, the active areas 215a-215d and 230a-230b can be formed by an epitaxial process, CVD process, other methods that are capable of forming the active areas 215a-215d and 230a-230b, and/or combinations thereof.

Referring to FIG. 6, Step 620 can form a plurality of first gate electrodes for all active transistors of the first memory array and a plurality of second gate electrodes for all active transistors of the logic circuit. The first gate electrodes are perpendicular to the first active area, and the second gate electrodes are perpendicular to the second active areas and parallel with the first gate electrodes. For example, Step 620 can form the gate electrodes 210a-210d and 225a-225c (shown in FIGS. 2A-2B) over the active areas 215a-215d and 230a-230b. The gate electrodes 210a-210d and 225a-225c can be formed by forming a deposition layer by physical vapor deposition (PVD), CVD, ALD, plating, and/or other suitable processes. The deposition layer can be defined by, e.g., photolithographic process and/or etch process for forming the gate electrodes 210a-210d and 225a-225c.

Referring to FIG. 6, Step 630 can form source/drain (S/D) regions of all active transistors of the first memory array and all active transistors of the logic circuit. For example, S/D regions (not labeled) of the active transistors 110, 115, 120, 125, 130, and 135 of the memory cell 101a and the active transistors 220a-220f of the logic circuit 105.

In embodiments, Step 630 can include only two ion implantation processes for implanting ions in the source/drain regions of the active transistors 110, 115, 120, 125, 130, 135, and 220a-220f. The direction of the ion implantation processes can be substantially perpendicular to the longitudinal direction of the active areas of the 215a-215d and 230a-230b. Each of the two ion implantation processes can be performed on each longitudinal side of the active areas of the 215a-215d and 230a-230b. Since only two ion implantation processes are performed for injecting ions, the cost of manufacturing the integrated circuit can be desirably reduced.

In embodiments, the S/D regions can be N-type S/D regions or p-type S/D regions. The n-type S/D regions can have dopants such as Arsenic (As), Phosphorus (P), other group V element, or the combinations thereof. The p-type S/D regions 247a and 247b can have dopants such as Boron (B) or other group III element. In embodiments, a thermal process and/or rapid thermal process (RTP) is performed after the ion implantation processes.

In embodiments, the method 600 can include forming at least one dummy memory cell adjacent to at least one of the active transistors of the memory array 101. The at least one dummy memory cell has a gate electrode that is parallel with the active areas 215a-215d or the gate electrodes 210a-210d (shown in FIG. 2A). For example, the gate electrode of the dummy memory cell can be formed by the same process forming the gate electrodes 210a-210d.

In embodiments, the method 600 can include forming another memory array, e.g., the memory array 451, coupled with the logic circuit 405. The method 600 can include forming a plurality of active areas 515a-515f for the active transistors 460, 465, 470, 475, 480, and 485 of the memory array 451. The method 600 can further include forming a plurality of the gate electrodes 510a-510d for the all active transistors of the memory array 451. The gate electrodes 510a-510d are perpendicular to the active area 215a-215d and parallel with the gate electrodes 210a-210d. The gate electrodes 510a-510d of the active transistors 460, 465, 470, 475, 480, and 485 can be formed by the same process forming the gate electrodes 210a-210d. The active areas 515a-515f of the active transistors 460, 465, 470, 475, 480, and 485 can be formed by the same process forming the active areas 215a-215d.

Figure 7:
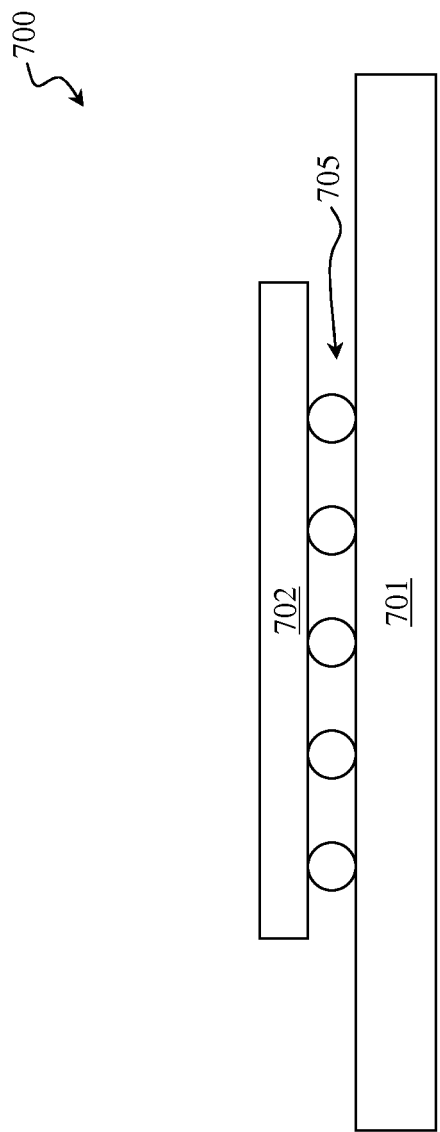
FIG. 7 is a schematic drawing illustrating a system including an exemplary integrated circuit disposed over a substrate board.

FIG. 7 is a schematic drawing illustrating a system including an exemplary integrated circuit disposed over a substrate board. In FIG. 7, a system 700 can include an integrated circuit 702 disposed over a substrate board 701. The substrate board 701 can include a printed circuit board (PCB), a printed wiring board and/or other carrier that is capable of carrying an integrated circuit. The integrated circuit 702 can be similar to the integrated circuit 100 described above in conjunction with FIG. 1. The integrated circuit 702 can be electrically coupled with the substrate board 701. In embodiments, the integrated circuit 702 can be electrically coupled with the substrate board 701 through bumps 705. In other embodiments, the integrated circuit 702 can be electrically coupled with the substrate board 501 through wire bonding. The system 700 can be part of an electronic system such as computers, wireless communication devices, computer-related peripherals, entertainment devices, or the like.

In embodiments, the system 700 including the integrated circuit 702 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first memory array; and
   a logic circuit coupled with the first memory array, wherein:
      all active transistors of all memory cells of the first memory array and all active transistors of the logic circuit are Fin field effect transistors (FinFETs) and have gate electrodes arranged along a first longitudinal direction;
      the all active transistors of the all memory cells of the first memory array and the all active transistors of the logic circuit have active regions arranged along a second longitudinal direction, and the second longitudinal direction is substantially perpendicular to the first longitudinal direction; and
      the first memory array further comprises at least one dummy memory cell disposed adjacent to at least one of the all active transistors of the first memory array, and the at least one dummy memory cell has a gate electrode arranged along the first longitudinal direction or the second longitudinal direction.

2. The integrated circuit of claim 1, wherein the first memory array is a static random access memory (SRAM) array.

3. The integrated circuit of claim 2, wherein the logic circuit includes a control logic, an address register, an input buffer, a sense amplifier, an output buffer, or any combinations thereof.

4. The integrated circuit of claim 1, wherein the gate electrodes of the all active transistors of the all memory cells of the first memory array have the same pitch.

5. The integrated circuit of claim 1 further comprises a second memory array coupled with the logic circuit, wherein all active transistors of all memory cells of the second memory array are Fin field effect transistors (FinFETs) and have gate electrodes arranged along the first longitudinal direction.

6. An integrated circuit comprising:
   a first memory array, wherein all of gate electrodes of all active transistors of all memory cells of the first memory array are arranged along a first longitudinal direction, all non-planar active regions for the all active transistors of the first memory array are arranged along a second longitudinal direction, and the first longitudinal direction is substantially perpendicular to the second longitudinal direction; and
   a logic circuit coupled with the first memory array, wherein all gate electrodes of all active transistors of the logic circuit are arranged along the first longitudinal direction and all non-planar active regions for the all active transistors of the logic circuit are arranged along the second longitudinal direction,
   wherein the first memory array further comprises at least one dummy memory cell and the at least one dummy memory cell has a gate electrode arranged along the first longitudinal direction or the second longitudinal direction.

7. The integrated circuit of claim 6, wherein the first memory array is a static random access memory (SRAM) array.

8. The integrated circuit of claim 7, wherein the logic circuit includes a control logic, an address register, an input buffer, a sense amplifier, an output buffer, or any combinations thereof.

9. The integrated circuit of claim 6, wherein the gate electrodes of the all active transistors of the all memory cells of the first memory array have the same pitch.

10. The integrated circuit of claim 6 further comprising a second memory array coupled with the logic circuit, wherein all of gate electrodes of all active transistors of all memory cells of the second memory array arranged along the first longitudinal direction and all non-planar active regions for the all active transistors of the second memory array arranged along the second longitudinal direction.

11. The integrated circuit of claim 6, wherein the all active transistors of the first memory array and the all active transistors of the logic circuit are Fin field effect transistors (FinFETs).

12. A method for forming an integrated circuit comprising:
   forming a plurality of first active areas for all active transistors of a first memory array over a substrate and a plurality of second active areas for all active transistors of a logic circuit over the substrate, wherein the plurality of first active areas and the plurality of second active areas are non-planar active areas;
   forming a plurality of first gate electrodes for the all active transistors of the first memory array and a plurality of second gate electrodes for the all active transistors of the logic circuit, wherein the first gate electrodes are perpendicular to the first active area, and the second gate electrodes are perpendicular to the second active areas and parallel with the first gate electrodes; and
   forming at least one dummy memory cell adjacent to at least one of the active transistors of the first memory array, wherein the at least one dummy memory cell has a gate electrode that is arranged along a direction parallel with the first active areas or the first gate electrodes.

13. The method of claim 12 further comprising:
   performing only two ion implantation processes for implanting ions in source/drain (S/D) regions of the all active transistors of the memory array and the logic circuit.

14. The method of claim 12 further comprising:
   forming a plurality of third active areas for all active transistors of a second memory array over the substrate; and
   forming a plurality of third gate electrodes for the all active transistors of the second memory array, wherein the third gate electrodes are arranged along a direction perpendicular to the second active area and parallel with the first gate electrodes.

15. The method of claim 12, wherein the logic circuit includes a control logic, an input/output (TO) interface, an address register, an input buffer, a sense amplifier, an output buffer, or any combinations thereof.

16. The method of claim 12, wherein
the formation of the plurality of first active areas comprises forming a plurality of first fin structures; and
the formation of the plurality of second active areas comprises forming a plurality of second fin structures.

* * * * *